United States Patent [19]
Brendecke et al.

[11] Patent Number: 5,477,009
[45] Date of Patent: Dec. 19, 1995

[54] RESEALABLE MULTICHIP MODULE AND METHOD THEREFORE

[75] Inventors: Walter H. Brendecke, Phoenix; Kenneth H. Schmidt, Mesa, both of Ariz.

[73] Assignee: Motorola, Inc., Schaumburg, Ill.

[21] Appl. No.: 210,863

[22] Filed: Mar. 21, 1994

[51] Int. Cl.⁶ ...................................... H05K 5/06
[52] U.S. Cl. ...................... 174/52.3; 29/825; 257/704
[58] Field of Search ...................... 257/678, 704, 257/710; 53/477, 478; 156/69, 106, 272.2; 174/52.1–52.4; 29/840, 841, 855, 856, 876, 825

[56] References Cited

U.S. PATENT DOCUMENTS

| | | | |
|---|---|---|---|
| 4,015,071 | 3/1977 | Peet | 219/105 X |
| 4,355,463 | 10/1982 | Burns | 29/827 |
| 4,356,047 | 10/1982 | Gordon et al. | 156/89 |
| 4,507,907 | 4/1985 | Wolfson | 156/69 X |
| 4,580,157 | 4/1986 | Honda | 357/84 |
| 4,680,618 | 7/1987 | Kuroda et al. | 357/74 |
| 4,721,543 | 1/1988 | Wolfson | 156/380.2 |
| 4,872,047 | 10/1989 | Fister et al. | 357/67 |
| 5,075,765 | 12/1991 | Norell | 357/74 |
| 5,307,240 | 4/1994 | McMahon | 361/728 |
| 5,317,196 | 5/1994 | Wong | 257/791 |
| 5,343,076 | 8/1994 | Katayama et al. | 257/717 |

*Primary Examiner*—Kristine L. Kincaid
*Assistant Examiner*—Christopher Horgan
*Attorney, Agent, or Firm*—Frank J. Bogacz; Robert M. Handy

[57] ABSTRACT

A multichip electronic module comprising a base for holding various components and a lid for sealing the module, is temporarily closed by a reworkable seal made from a thermoplastic material. The seal is hermetic so that the module can be tested under ambient conditions approximating actual use. If the module fails the functional test, the lid is easily removed for repair. The thermoplastic material is located in a special grove near the periphery of the base or lid next to the mating surfaces which form part of a final seal for the module. After a module has been repaired, the lid is finally soldered or welded to the base using portions of these mating surfaces which are free of the thermoplastic material. There is no need to remove the thermoplastic material used for the temporary seal.

15 Claims, 7 Drawing Sheets

RESEALABLE MULTICHIP MODULE AND METHOD THEREFORE

FIELD OF THE INVENTION

The present invention concerns an improved means and method for electronic modules containing multiple components and, more particularly, an improved means and method for providing a multichip module having a removable and resealable hermetic lid.

BACKGROUND OF THE INVENTION

As used herein, the words "multichip module", singular or plural, are intended to refer to an electronic assembly which has therein a plurality of interconnected components (e.g., transistors, diodes, integrated circuits, resistors, capacitors, inductors, etc., or combinations thereof). As used herein, the word "chip", singular or plural, is intended to refer generally to any type of component within the multichip module. The particular choices of components and their arrangement and interconnection with the multichip module are outside the scope of the present invention.

Multichip modules are much used in modern day electronic equipment, especially equipment where high performance, reliability and ruggedness are important. Oftentimes, in order to fully test a multichip module it is necessary to provide a hermetic lid or cap in order to protect the chips and wiring therein from the ambient atmosphere during testing. This is especially true where the tests include temperature and/or humidity extremes. In the event that the tests show that one or more chips within the module must be replaced or that some portion of the wiring must be repaired, then one must be able to decap the module without damaging any of the internal parts or interfering with the ability to reseal the module after repairs are completed. AS used herein, the words "lid", "cap" and "cover", singular or plural, are intended to have the same meaning and include any removable means (other than potting compounds or conformal coatings) for closing a multichip module to protect it from the ambient atmosphere.

One prior art means for obtaining a resealable multichip module is to provide a lid held in place by screws or clamps and sealed by gaskets. While such arrangement may be readily sealed, opened for repair and then resealed, it is generally expensive and bulky and does not usually provide a high degree of long term hermeticity after closure.

Another arrangement which has been used in the prior art is to seal the lid to the module base with metal or glass solders or brazing materials. Unless specifically indicated, the word "solder", singular or plural, as used herein, is intended to refer to glasses, metals and combinations thereof that soften or melt when heated and which are usable for joining various materials and encompass those materials conventionally used for soldering or brazing. While solder seals can generally provide a high degree of hermeticity, modules sealed in this manner are difficult to open and reseal. This is because, glass solders tend to devitrify and/or metal solders tend to alloy with the lid and module materials during the initial sealing operation, so that the thermal and mechanical properties of the solder are different after the initial seal is completed. Thus, when one attempts to decap a solder sealed module, the solder may require a much higher temperature to soften or melt enough to permit lid removal and resealing, with a consequent adverse impact on the chips and wiring within the module. Further, it may be difficult or impossible to achieve hermetic closure during reseal after repairs are completed.

Modules that are welded closed must have the weld ground off or etched off in order to be opened for repair. Such operations generally introduce undesirable particulate material and other contaminates into the module during decapping. Also, it may be difficult or impossible to reweld the package after repairs are complete. Hence, opening and resealing of welded modules is generally undesirable.

Thus, there continues to be a need for improved means and method for multichip modules that may be temporarily sealed to a substantially hermetic condition (e.g., to permit adequate testing) and, if necessary, decapped for repairs, and then resealed or further sealed in a manner that promotes long term hermeticity.

Accordingly, it is an advantage of the present method to provide an improved means and method for temporarily sealing multichip modules so that, for example, tests may be performed and then, if necessary, decapped for repairs and then resealed or further sealed using materials or techniques generally known to provide good long term hermeticity. It is a further advantage to provide such without use of gaskets with screws or clamps. It is a still further advantage to provide such in a manner that readily adapts to different base and lid configurations. It is a yet further advantage to provide such in a manner that avoids the decapping and resealing problems associated with prior art glass or metal solders.

SUMMARY OF THE INVENTION

There is provided, in a first embodiment, an electronic module comprising a base for supporting one or more electronic components in a central region thereof and a lid for closing the module, wherein the base has an exterior periphery and a first region for mating with the lid, and wherein the lid has a second region for mating with the base, a recess located in either the base or the lid adjacent to the respective mating region of the base or lid in which it is located and which, when the base and lid are joined so that first portions of the mating regions are in substantial contact, the recess faces a second portion of the mating region of the lid or base in which it is not located and communicates with either the central region of the base or the periphery of the base or lid but not with both the central region and the periphery at the same time, and a thermoplastic sealing material located in the recess for demountably sealing the lid and base. It is desirable that the mating regions are substantially free of the thermoplastic sealing material to permit subsequent final sealing by welding or soldering.

There is provided in a second embodiment, a method for making a multichip electronic module comprising, providing a base for supporting one or more electronic components in a central region thereof and providing a lid for closing the module, wherein the base has an exterior periphery and a first region for mating with the lid, and wherein the lid has a second region for mating with the base, providing a recess located in either the base or the lid adjacent to the respective mating region of the base or lid in which it is located and which, when the base and lid are joined so that first portions of the mating regions are in substantial contact, the recess faces a second portion of the mating region of the lid or base in which it is not located and communicates with either the central region of the base or the periphery of the base or lid but not with both the central region and the periphery at the same time, providing a thermoplastic sealing material located in the recess for demountably sealing the lid and base, and heating the thermoplastic material to seal the lid and base together. It is desirable that the providing and heating steps comprise maintaining the mating regions substantially free of the thermoplastic material.

It is further desirable to test the module, and if no errors or defects are detected final seal the module by welding or soldering. If errors or defects are detected, then to reheat the thermoplastic material to remove the lid, repair or inspect the module, and then reseal the lid and base and retest. The final seal is preferably done by welding or soldering or brazing.

The present invention will be more fully appreciated by considering the drawings provided herein and accompanying text.

BRIEF DESCRIPTION OF THE DRAWINGS

FIG. 15 is analogous to FIG. 9

DETAILED DESCRIPTION OF THE DRAWINGS

Figure 1:
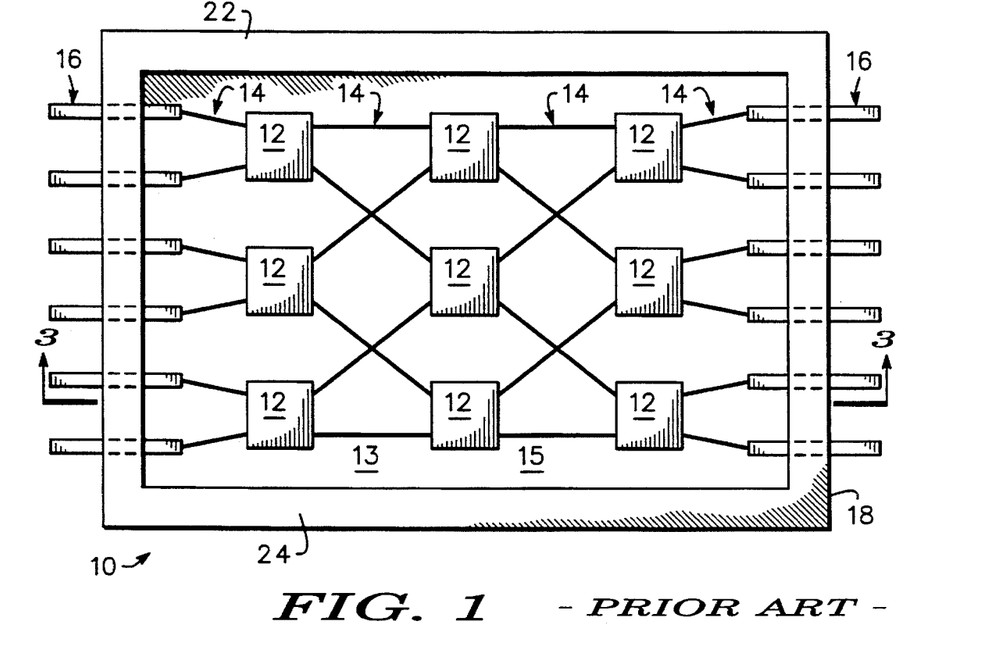
FIG. 1 is a simplified top view of the base portion of a multichip module according to the prior art and with the lid removed.
Figure 2:
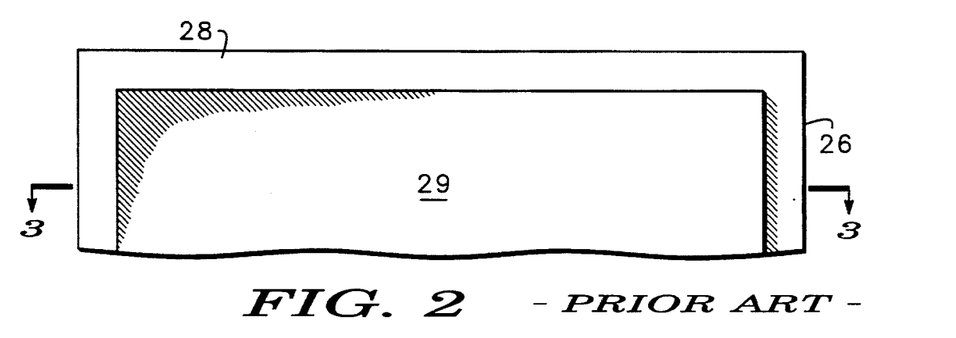
FIG. 2 is a plan view of a portion the underside of a lid of a multichip module of the type shown in FIG. 1 (viewed as from inside the module), according to the prior art.

FIG. 1 shows a plan view of a typical multichip module 10 with the lid removed, according to the prior art. Multichip module 10 comprises multiple chips or other components 12 which are interconnected by wires or metal traces 14 and to external pins 16. The exact nature of chips 12 and how they are interconnected by wires 14 to each other and to external leads 16, and the particular location of chips 12, wires 14 and leads 16 are not important to the present invention.

Figure 3:
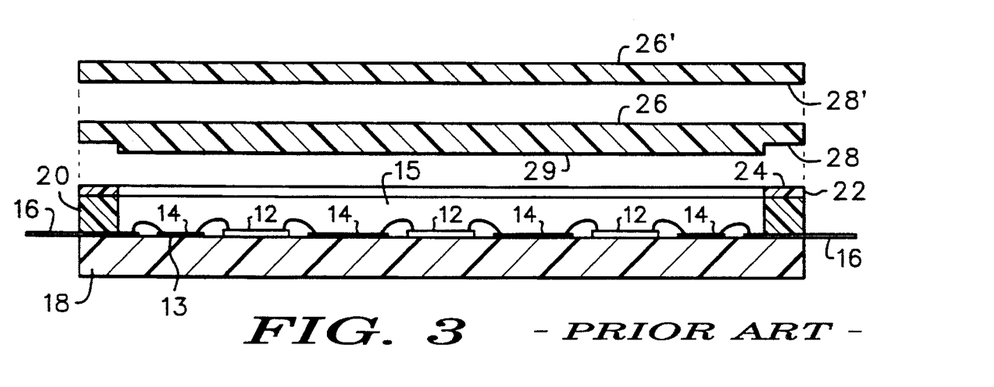
FIG. 3 is an exploded partial cross sectional view through the base portion and lid of FIGS. 1–2, just prior to joining the lid and base, according to several lid embodiments.
Figure 4:
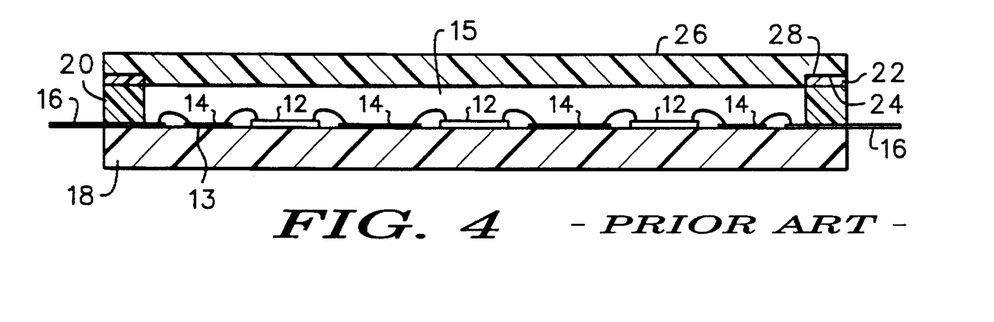
FIG. 4 shows a partial cross-sectional view of the module of FIGS. 1–3 with the lid and base joined to close the module.

Referring now to FIGS. 1–4, prior art module 10 has base portion 18 with interior surface 13 in cavity 15 on which components 12 and wires 14 are located. Base 18 of module 10 may include insulating ring 20 which seals around leads 16 so that they may provide electrical entry into module 10. Insulating region 20 is generally surrounded by annular-shaped sealing region 22 having outward facing annular sealing surface 24. Lid 26 (see FIGS. 2–4) having annular sealing surface 28 is placed in contact with base 18 of module 10 so that sealing surfaces 24 and 28 mate. Prior art lid 26 illustrated in FIGS. 2–4 may be provided with step 29 so that it self-aligns within sealing ring 22. Lid 26' illustrated in FIG. 3 shows an alternate form in which step 29 is omitted. FIG. 4 shows module 10 wherein base 18 and lid 26 have been joined on mated sealing surfaces 24, 28. Sealing surfaces 24, 28 are conventionally joined by welding or soldering (not shown).

Figure 5:
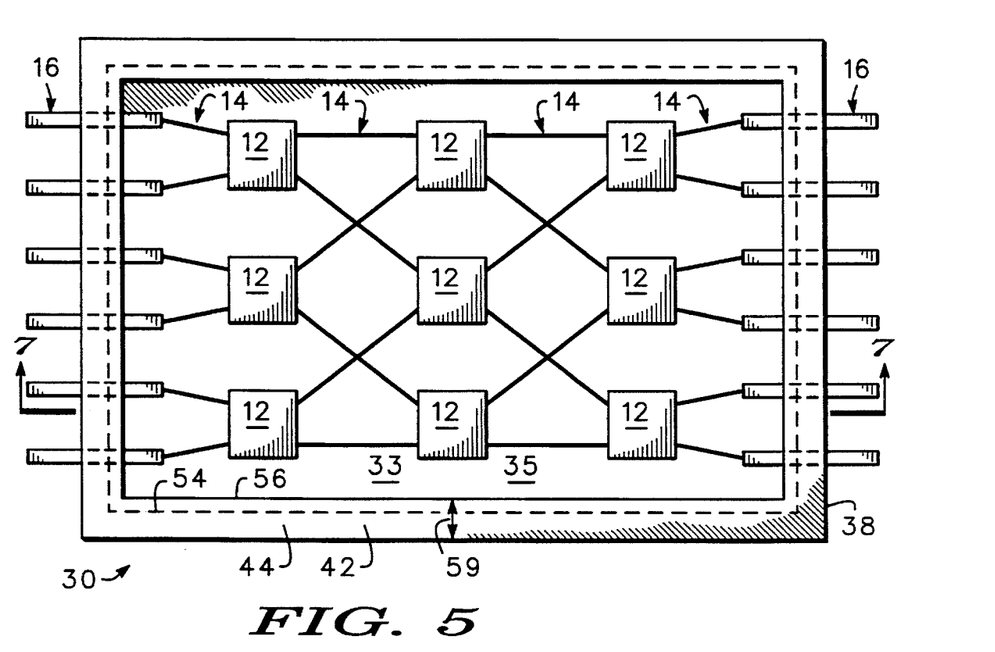
FIGS. 5–8 are views similar to FIGS. 1–4, respectively, but according to a first embodiment of the present invention.

As has been previously been noted, once a module of the type depicted in FIGS. 1–4 has been welded or soldered to provide the cross-sectional arrangement shown in FIG. 5, it is very difficult to remove lid 26 without destroying the module or damaging the internal components. This causes great difficulty with modules that must be sealed prior to testing since if a defect or error is noted in the performance of the module, it is very difficult or impossible to effect repairs. Accordingly, there continues to be a need for an improved means and method for temporarily hermetically sealing complex modules to permit adequate testing, but still leave the module in a state where the lid can be readily removed for repair, if necessary, and then sealed or resealed using techniques and materials known to provide long-term hermiticity. This is accomplished by the present invention.

While the modules described herein are illustrated as being of generally rectangular shape, their particular dimensions and number of sides are not important to the present invention. The modules may also be circular. Further, while the modules described herein are illustrated as having certain external electrical connections, their particular configuration is not important to the present invention and the external electrical connections may be located on any surface or periphery of the module.

For purposes of illustration, module 30 of the present invention is generally similar to module 10 of FIGS. 1–4 but differing in important details illustrated in FIGS. 5–20. FIGS. 5–8 are similar to FIGS. 1–4. FIGS. 9–20 are partial cross sections generally corresponding to the left hand portions of FIGS. 7–8, but illustrating further embodiments of the present invention.

In the first embodiment of the present invention illustrated in FIGS. 5–8, module 30 comprises base 38 analogous to base 18 on which is insulating region 40 analogous to insulating region 20 and sealing ring 42 analogous to sealing ring 22 with sealing surface 44 analogous to sealing surface 24. Lid 46 of module 30 according to the present invention is analogous to lid 26 and has sealing surface 48 which mates with sealing surface 44 of base 38. For simplicity Of illustration, chips 12 and wires 14 have been omitted from FIGS. 7–20.

The embodiment of the present invention shown in FIGS. 5–8 differs from the prior art through the provision of annular recess 50 provided in lid 48 and thermoplastic material 52 provided in recess 50. Recess 50 has inner perimeter 53 which, preferably, lies within cavity 35 of module 30 and outer perimeter 54 which lies over sealing surface 44 (see dashed line in FIG. 5), when lid 46 and base 38 are assembled. Floor 33 of module 30 is analogous to floor 13 of module 10 on which components 12 and wires 14 are secured. Recess 50 is positioned on lid 46 such that recess 50 communicates with central cavity 35 of module 30, that is, interior perimeter 56 of seal ring 42 conveniently lies within width 55 of recess 50, between inner perimeter 53 and outer perimeter 54, as shown by the dashed line in FIG. 6. When lid 46 and base 38 are brought together so that surfaces 44 and 48 are in substantial mating contact while applying sufficient heat to soften thermoplastic material 52, thermoplastic material 52 present in recess 50 produces a substantially hermetic seal between lid 46 and base 38 on a portion of surface 44 of seal ring 42.

It is generally desirable to apply some force to clamp the base and lid together to insure that mating surfaces 44, 48 are substantially in intimate contact around the entire periphery of module 30. When soldering is the intended means for providing final sealing, then intimate contact includes a solder layer or pre-form 82 (see FIGS. 15–16) located between the mating surfaces. Use of a clamping force is desirable since it permits hermetic seals to be achieved at lower temperatures and helps insure that the portions of mating sealing surfaces 44, 48 that will be later welded or soldered together remain free of thermoplastic material 52. A convenient method for clamping the parts to is to have a weight on the base or lid (whichever is facing up) while the thermoplastic material is heated and cooled.

Annular sealing surface 48 of lid 46 generally has a lateral width 57 which is smaller than lateral width 59 of surface 44 of sealing ring 42. By arranging recess 50 so that portion 61 (see FIG. 6) is exposed to central cavity 35 of module base 38, central cavity 35 forms a relief space and any excess portion of thermoplastic material 52 present in recess 50 is allowed to extrude slightly into central cavity 35 and thereby not extrude between mating surfaces 44, 48. This is an important feature of the present invention since thermoplastic material 52 is intended primarily to provide a temporary seal for testing purposes while a final seal is provided using mating surfaces 44, 48 either by, for example, welding or soldering. Therefore, keeping the mating portions of Surfaces 44, 48 free of plastic is important.

Figure 6:
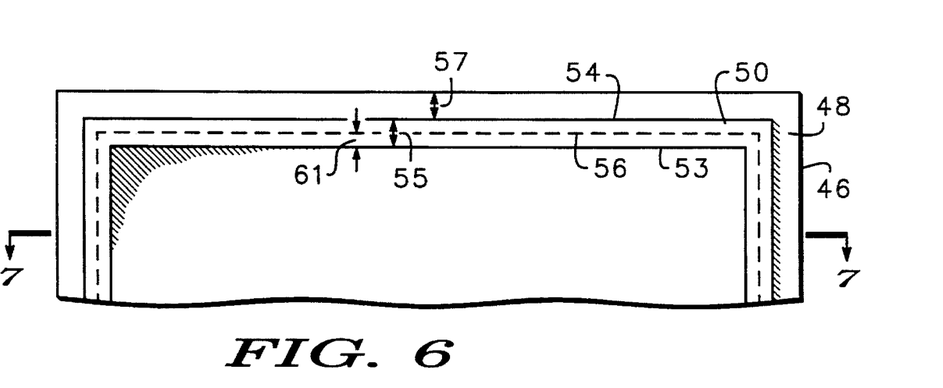
Figure 7:
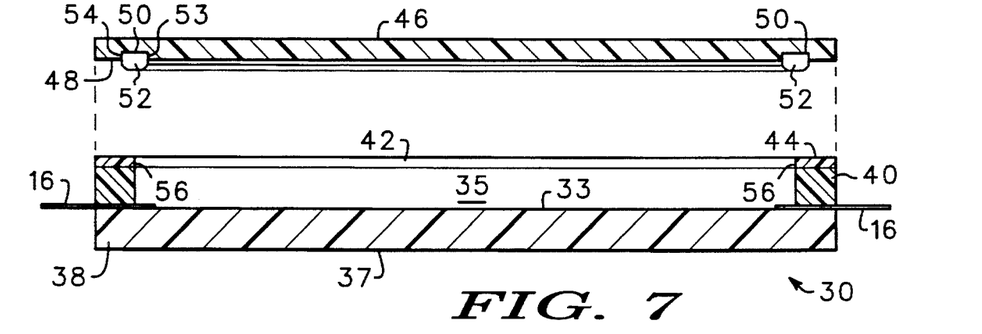
Figure 8:
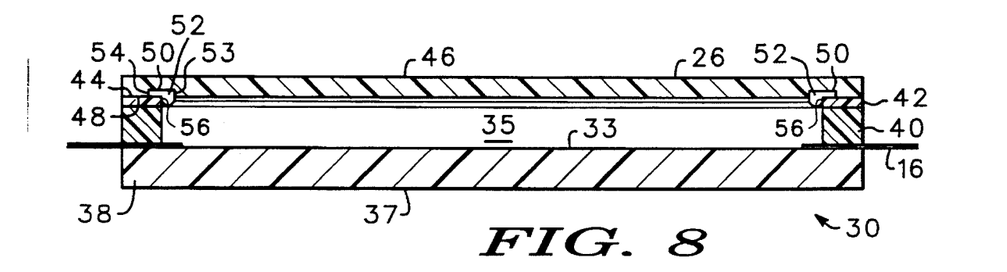
Figure 9:
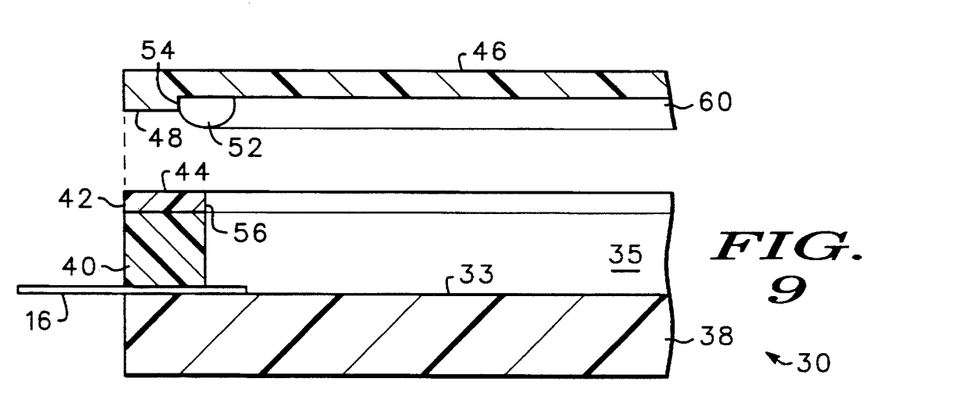
FIG. 9 shows a partial cross-sectional view similar to a left hand portion of FIG. 7, of a module analogous to that shown in FIGS. 5–8 but according to a further embodiment of the present invention, and with the lid positioned ready for assembly but separated from the base.
Figure 10:
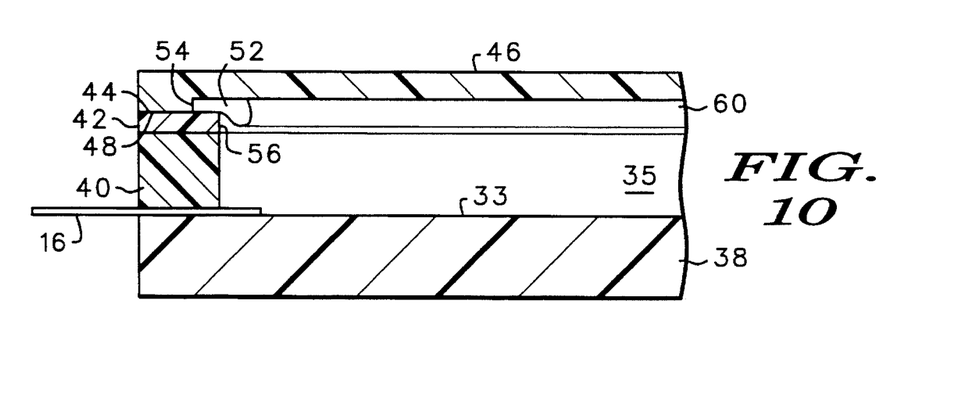
FIG. 10 is the same as FIG. 9 but with the lid sealed to the base.

FIGS. 9–10 are cross sections similar to the left hand portions of FIGS. 7–8, but showing a different embodiment of the present invention wherein recess 60 for containing thermoplastic material 52, rather than having a comparatively narrow annular shape (such as recess 50 of width 55 illustrated in FIGS. 6–8) extends over a larger portion of lid 46. Outer perimeter 54 of recess 60 is in substantially the same location as outer perimeter 54 of recess 50, but inner perimeter 53 illustrated in FIGS. 6–8 is missing or far removed from outer perimeter 54. When lid 46 and base 38 are sealed together as shown in FIG. 10, any excess amount of thermoplastic material 52 is allowed to extend into the relief space created by the combination of cavity 35 in base 38 and extended recess 60 in lid 46.

Figure 11:
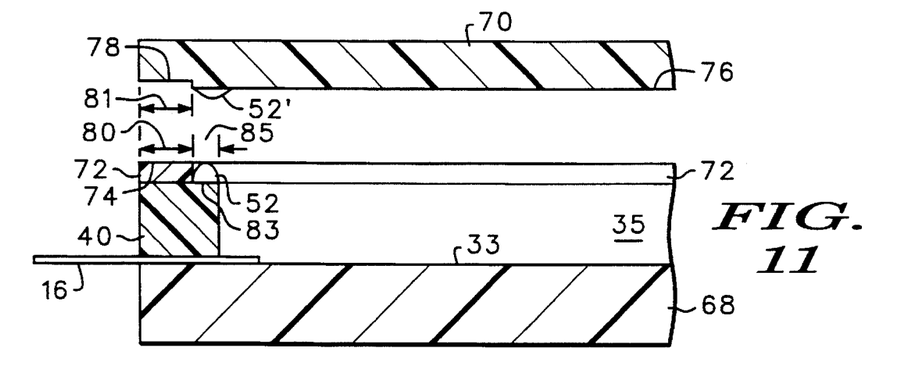
FIGS. 11–12 are similar to FIGS. 10–11, but according to a still further embodiment of the present invention.
Figure 12:
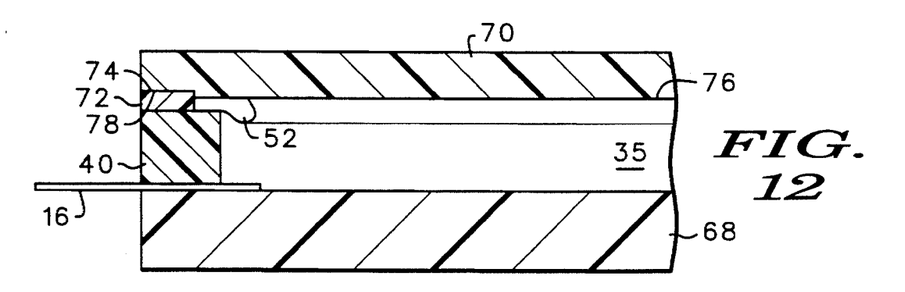
Figure 13:
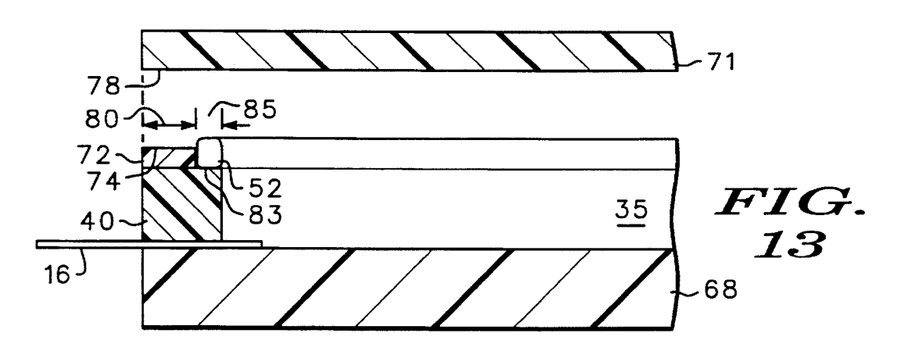
FIGS. 13–14 are similar to FIGS. 9–10, but according to a yet further embodiment of the present invention.
Figure 14:
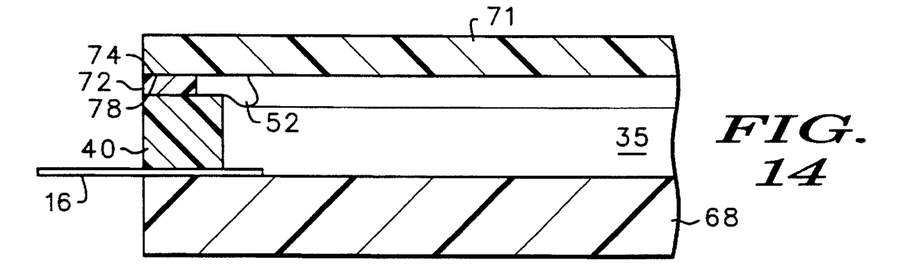

FIGS. 11–12 and 13–14 are cross sections similar to FIGS. 9–10, but showing still further embodiments of the present invention. FIGS. 11, 13 show multichip module 30 of the present invention before sealing of the lid, and FIGS. 12, 14 show respectively, multichip module 30 after the lid has been sealed to the bases in their respective configurations. In FIGS. 11–12, base 68 of multichip module 30 differs from base 38 illustrated in FIGS. 5–10 in that surface 74 of sealing ring 72 has lateral width 80 which is narrower than lateral width 59 of surface 44 of sealing ring 42 of FIGS. 5–10. Lateral with 81 of sealing surface 78 of lid 70 is likewise narrower than lateral width 57 of sealing surface 48 of lid 46.

This arrangement permits thermoplastic material 52 to be placed on shelf 83 of width 85 of modified base portion 68 as shown in FIGS. 11–14. When lids 70, 71 of FIGS. 11, 13 and base 68 are assembled as shown in FIGS. 12, 14, a similar seal is provided by the thermoplastic material 52. The arrangement which are illustrated in FIGS. 11–12 and in FIGS. 13–14 differ only in the shape of lids 70, 71, respectively. Lid 70 has additional step 76 which protrudes slightly into cavity 35 when lid 70 and base 68 are assembled. This permits easy alignment of lid 70 and base 68. In FIGS. 13–14, lid 71 has a substantially planar lower surface and no alignment step is included. Either arrangement works satisfactorily. While in FIGS. 11–14, thermoplastic material 52 is shown as being placed on shelf 83 of base 68 in proximity to sealing ring 72, it may equally well be placed on the mating portion of the lid or both, as shown for example by thermoplastic region 52' FIG. 11. Either arrangement works satisfactorily.

Figure 15:
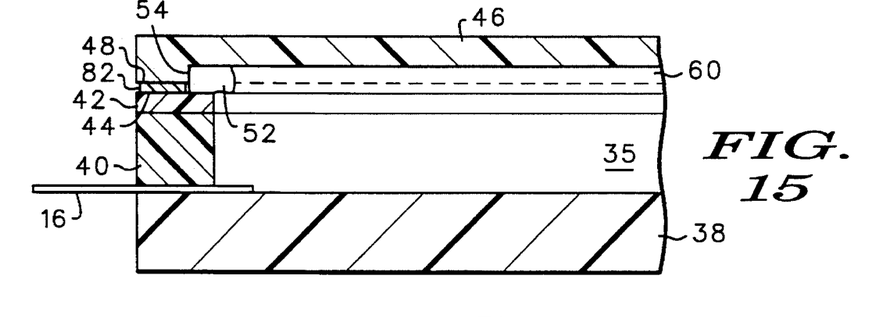
Figure 16:
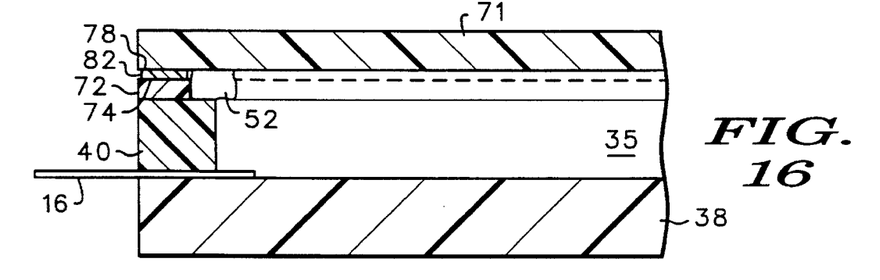
FIG. 16 is analogous to FIG. 14, but according to additional embodiments of the present invention.

FIG. 15 is analogous to FIG. 10 except that the use of solder 82 to join sealing surfaces 44, 48 is shown. FIG. 16 is analogous to FIG. 14 except that the use of solder 82 to join sealing surfaces 74, 78 is shown.

Figure 17:
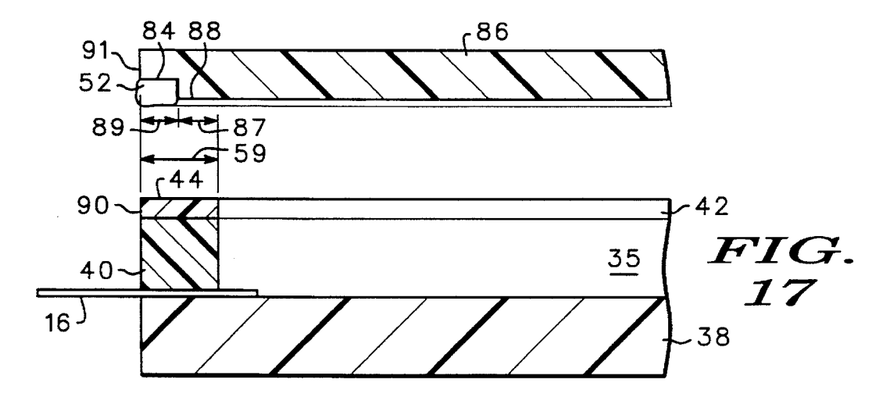
FIGS. 17–18 and FIGS. 19–20 are analogous to FIGS. 9–10, but according to still additional embodiments of the present invention.
Figure 18:
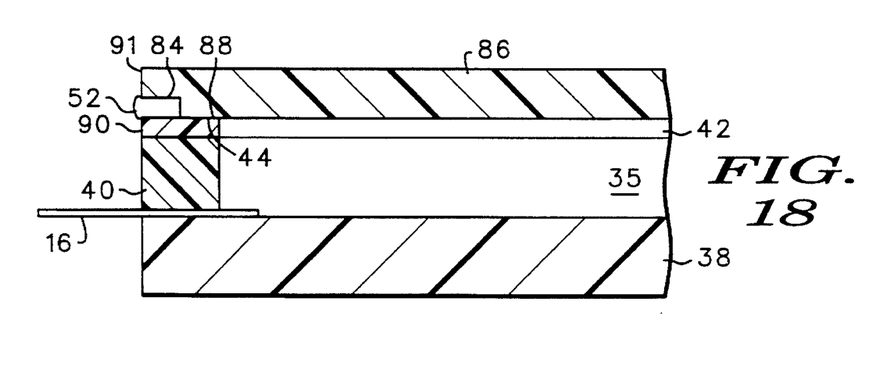

FIGS. 17–18 and FIGS. 19–20 are analogous to FIGS. 9–10, but illustrating further embodiments of the present invention. Base 38 with cavity 35 and insulating region 40 and sealing ring 42 having sealing surface 44 in FIG. 18 are substantially the same as the similarly identified regions in FIG. 9. In FIGS. 17–18, lid 86 mates with base 38. Lid 86 has recess 84 of lateral width 89 for holding thermoplastic material 52 located adjacent sealing surface 88. Sealing surface 88 of lid 86 mates with sealing surface 44 of base 38. Sealing surface 88 has width 87. In the arrangement of FIGS. 17–18, recess 84 communicates with peripheries 90, 91 of base 38 and lid 86 so that peripheries 90, 91 form a relief space. In this manner, any excess amount of thermoplastic material 52 which is more than is needed to seal lid 86 and base 38 together (e.g., see FIG. 18) may extrude to the outside of the package, and not be forced between sealing surfaces 44, 88.

Figure 19:
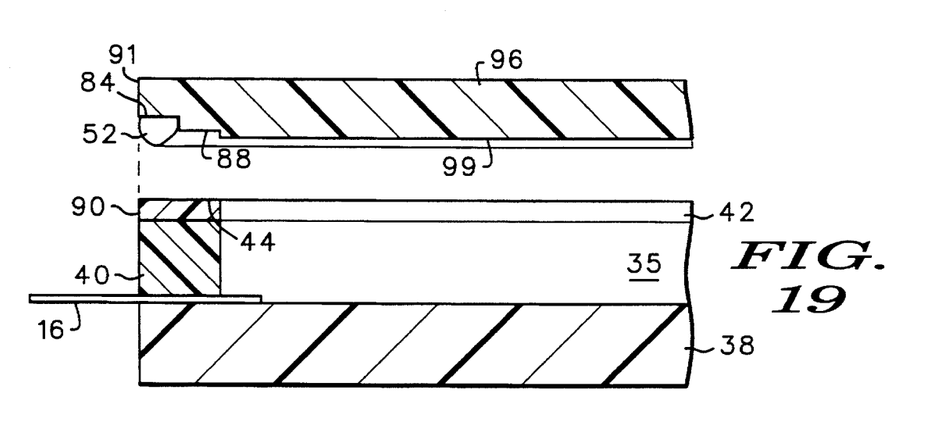
Figure 20:
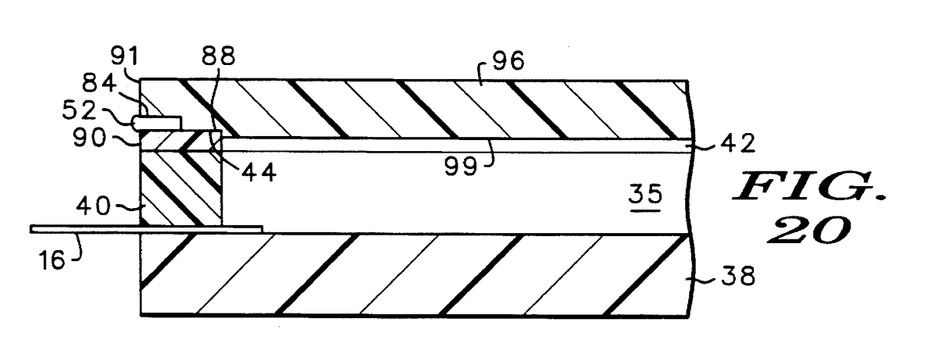

FIGS. 19–20 are analogous to FIGS. 17–18 except that lid 96 differs from lid 86 in the provision of alignment step 99 which when lid 96 and base 38 are assembled, protrudes slightly into central cavity 35. In other respects, the construction and assembly of lid 96 and base 38 of FIGS. 19–20 are similar to lid 86 and base 38 of FIGS. 17–18.

Figure 21:
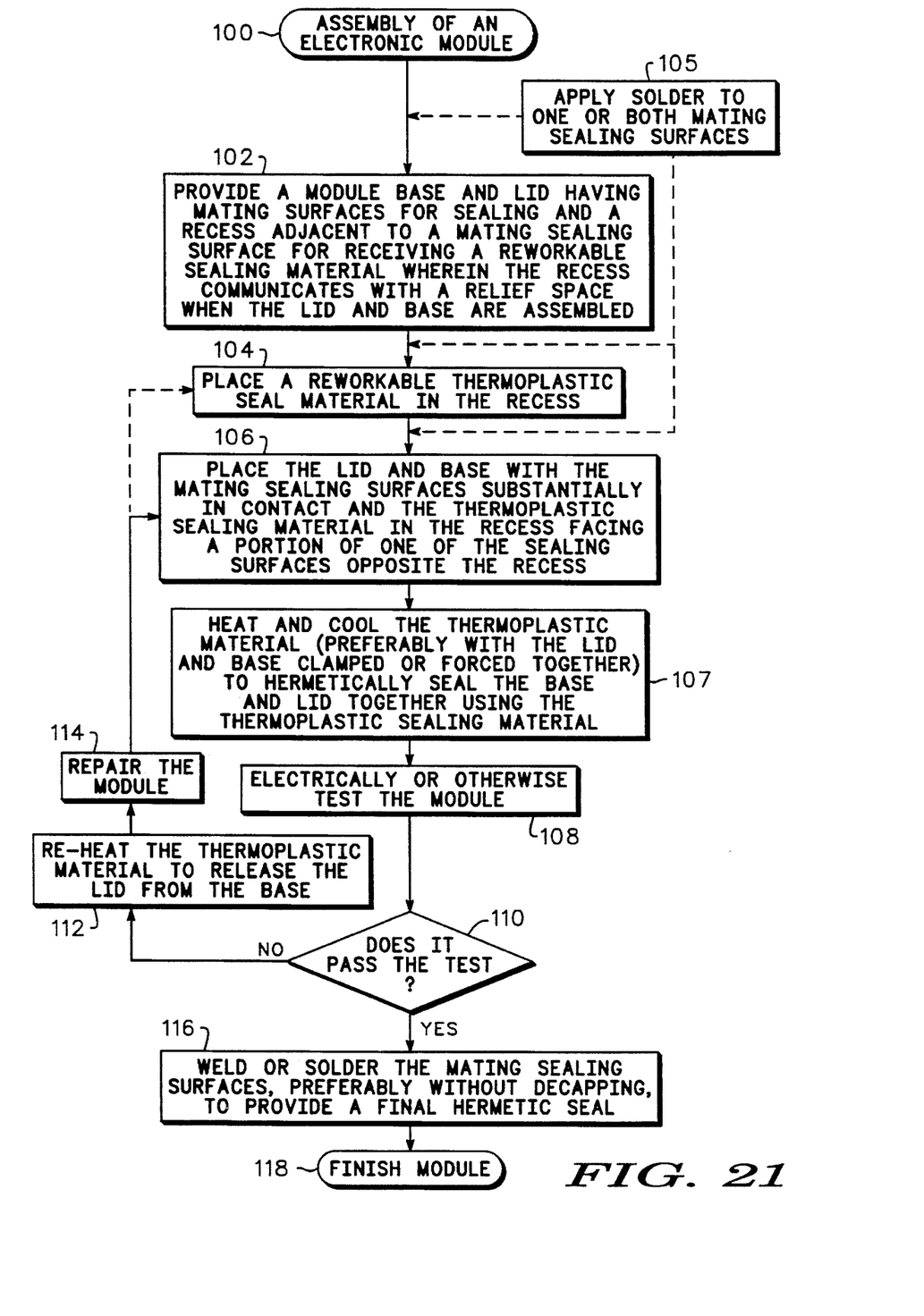
FIG. 21 is a flow chart illustrating the practice of the method of the present invention according to a preferred embodiment.

FIG. 21 is a flow chart illustrating the practice of the method of the present invention. Referring now to FIG. 21, activity 100 comprising the assembly of an electronic module begins with step 102 of providing a module base and lid having mating surfaces for sealing and a recess adjacent to a mating sealing surface for receiving a reworkable sealing material wherein the recess communicates with a relief space when the lid and base are assembled, one of which has a recess for accepting a resealable bonding material and mating surfaces for bonding. In step 104, a thermoplastic sealing material is placed in the recess. In step 106, the lid and base are placed with the mating sealing surfaces substantially in contact and the thermoplastic sealing material in the recess facing a portion of one of the sealing surfaces opposite the recess. If it is intended to make the final module seal with solder, then solder may be applied to one or both mating sealing surfaces, as indicated in step 105, before or after steps 102 or 104 or before step 106.

In step 107, the thermoplastic material is heated and cooled, preferably with the lid and base clamped or forced together, to hermetically seal the base and lid together using the thermoplastic material. Applying a weight to the lid or base (whichever is uppermost) is a convenient means of applying such force.

The sealed module is then electrically or otherwise tested in step 108 and according to the result, reworked or not as indicated by decisions block 110. If the module does not pass the test ("NO" branch), then the thermoplastic is reaheated in step 112 so that the lid can be removed, and in step 114 the module is repaired. Following repair, the module is returned to step 104 or 106 as is appropriate depending upon the condition of the thermoplastic sealing material in the recess, and resealed according to steps 104 (optional) and steps 106, 107 and retested in step 108. If after opening the module in step 112, the thermoplastic material needs to be replaced before resealing, this can be accomplished by dissolving the thermoplastic material in an appropriate solvent and then replacing it in step 104. Loop 112, 114, 104, 106, 107, 108 may be continued until a fully functional module is obtained ("YES" branch) from decision block 110. The module is then passed to step 116 wherein the final sealing operation is performed by welding or soldering the mating surfaces together to provide a final hermetic seal, and the finished module delivered to output 118.

EXAMPLE

The following is an example of the arrangement and practice of the present invention.

Multilayer ceramic bases 38 of thickness of about 1.14 mm thickness and lateral dimensions of about 25×225 mm to 51×76 mm were used. External electrical contact to these modules was made through metallized regions on the exterior lower surface of base 38, but this is not significant so far as the present invention is concerned.

Seal ring 42 was an annular shaped rectangular ring of Ni plated Kovar™ about 1.6 mm thick, brazed onto ceramic base 38. Upper surface 44 of seal ring 42 was plated with a thin layer of Au to facilitate soldering and/or welding. Since, the electrical contacts for these modules passed through lower surface 37 (see FIGS. 7–8) of ceramic base 38, use of insulating ring 40 was unnecessary. Bases of this type may be obtained from numerous suppliers well known in the industry, as for example, Kyocera America, San Diego, Calif. and Coors, Chattanooga, Tenn.

In the experimental samples, recess 50 was located in lid 26, as shown for example in FIGS. 6–8. Surface 44 on sealing ring 42 had a lateral width 59 of about 0.76 mm, sealing surface 48 on lid 46 had a lateral width 57 of about 0.38 mm, and recess 50 in lid 46 had lateral width 55 of about 0.51 mm. When lid 46 and base 38 were assembled in the desired position, about 0.38 mm of recess 50 would face sealing surface 44 and about 0.13mm of recess 50 would overlap into cavity 35 of base 38 which acted as the relief space. Lid 46 was Ni plated Kovar™ of about 0.38 mm thickness. Cavity 50 was a substantially flat bottomed annular channel about 0.13mm deep, but a flat bottom is not essential. What is important is that recess 50 extend into a region that can act as a relief space for receiving any excess thermoplastic material as sealing surfaces 44, 48 are forced together before and during thermoplastic bonding.

Thermoplastic material 52 is desirably provided in a volume at least sufficient to fill recess 50, although larger or smaller amounts may also be used. Thermoplastic material 52 may have a volume larger or smaller than the volume of recess 50, but sealing becomes more difficult as the volume of sealant 52 departs significantly from the volume of recess 50. An amount of sealant 52 in the range of about 100–150% of the volume of recess 50 is convenient, with about 105–125% of the volume of recess 50 being preferred. The volume of recess 50 is calculated assuming that it is closed by a surface located substantially in the position of the sealing surface which it faces on assembly of the module.

Those of skill in the art will understand based on the description herein that thermoplastic materials exhibit a range of temperature within which joining of other materials may be accomplished without causing significant decomposition of the thermoplastic material. For purposes of this invention, this range of temperatures is referred to as the sealing or bonding temperature range and the sealing or bonding temperature is a particular temperature within that range chosen by the user consistent with other requirements of the particular materials or structure being sealed together and the process being used. In general, the higher the temperature within the bonding temperature range, the lower the viscosity of the material and the shorter the time required to obtain a good seal. The bonding temperature range, decomposition temperature and minimum rework temperature are parameters usually provided by the supplier of the particular thermoplastic material chosen by the user.

For example, Type 393 Thermoplastic Adhesive supplied by Alpha Metals, Inc., Jersey City, N.J., was used to bond lids 46 to bases 38 according to the arrangement shown in FIGS. 5–8. This material has a bonding range of 160°–220° C., onset of decomposition at about 250°–270° C., and a minimum rework (e.g., decapping) temperature of about 170° C. Thermoplastic lid sealing was accomplished using this material in a standard laboratory type furnace at a temperature of about 185° C. Decapping was performed at a similar or slightly higher temperatures less than the decomposition temperature, but any temperature within the manufacturer's recommended ranges for the particular material chosen can be used.

While the Alpha Metals Type 393 material is preferred for thermoplastic 52, other thermoplastic materials may also be used, provided their properties are consistent with the overall module requirements. Dupont, Inc., of Wilmington, Del. also provides thermoplastic materials. Those of skill in the art will be able to choose, based on the teachings herein and without undue experimentation, suitable thermoplastic materials suitable for their particular application.

To facilitate thermoplastic sealing and hold mating surfaces 44, 48 together while thermoplastic sealing was occurring, a weight of approximately 14 Kgms was placed on, for example, a 51×76 mm module having a base and lid of the type described herein, while it was being heated to thermoplastic sealing temperature and then cooled. The base and weight were conveniently preheated to the sealing temperature. Then the lid and base were aligned to form the module assembly ready for sealing and the assembly and weight together placed in the oven at temperature for about 10 minutes. The assembly and weight were removed from the oven and allowed to return to room temperature with the weight in place. The thermosealed module was tested for hermeticity using standard techniques well known in the art and found to be leak free.

After electrical testing and any necessary rework and resealing, final sealing of the modules is preferably accomplished by seam welding the periphery of lid 46 to the periphery of seal ring 42. Seam welding apparatus is manufactured by SSEC., Inc. of Fort Washing, Pa. Alternatively, soldering may be used, in which case one or both of surfaces 44, 48 is precoated with solder or a solder pre-form provided there between before lid 46 and base 38 are joined by thermoplastic 52. Seam welding and soldering are both conventional.

When soldering is used for the final seal, the solder chosen desirably has a bonding temperature higher than the bonding and rework temperatures being used for the thermoplastic material. In this manner, temporary bonding, decapping, rework and thermoplastic resealing may be accomplished without disturbing the latent solder seal. As used herein with respect to solder materials, the term bonding temperature is intended to refer to that temperature required to effect a bond by the solder to the materials being joined. In the case of metals and metal alloys that have a discrete solid-liquid transition temperature, this is melting point of the metal solder. In the case of glass solders which soften gradually, this is a temperature within the bonding temperature range recommended by the manufacturer for the particular glass material being considered, wherein the glass becomes sufficiently fluid to effect a bond to the materials being joined in the time required by the process being used. Persons of skill in the art can readily determine bonding temperatures for a wide variety of glass or metal solders by consulting manufacturer's tables or standard reference works or performing simple tests well understood in the art.

Based on the foregoing description, it will be apparent to those of skill in the art that the present invention solves the problems and achieves the goals set forth earlier, and that it has substantial advantages as pointed out herein. Namely, the present invention provides an improved means and method for temporarily sealing multichip modules so that, for example, tests may be performed and then, if necessary, the module decapped for repair and then resealed or further sealed using materials or techniques (e.g., soldering or welding) generally known to provide good long term hermeticity.

It is a further advantage of the present invention to provide such capability without use of permanent gaskets, screws or clamps. It is a still further advantage to provide such in a manner that readily adapts to different base and lid configurations. It is a yet further advantage to provide such in a manner that avoids the decapping and resealing problems associated with prior art glass or metal solders or welds. Further, the means and method of the present invention is particularly simple and inexpensive to implement compared to prior art techniques. Still further, the means and method of the present invention introduces little or no contamination into the interior of the module.

While the present invention has been described in terms of particular materials, structures and steps, these choices are for convenience of explanation and not intended to be limiting and, as those of skill in the art will understand based on the description herein, the present invention applies to other choices of materials, arrangements and process steps, and it is intended to include in the claims that follow, these and other variations as will occur to those of skill in the art based on the present disclosure.

We claim:

1. A resealable electronic assembly, comprising:

a base having a central region for supporting one or more electronic components and having a first annular sealing region lying between said central region and a periphery of said base;

a lid intended to be joined to said base to seal said assembly, said lid having a second annular sealing region, wherein said first and second annular sealing regions mate when said lid and base are joined together;

an annular recess in said lid located proximate said second annular sealing region so that, when said base and lid are joined, a first portion of said first annular sealing region faces a first portion of said second annular sealing region and said recess faces a second portion of said first annular sealing region and communicates with a relief space of said base or lid; and a thermoplastic sealing material located in said recess for removably sealing said base and lid together.

2. The assembly of claim 1 wherein said facing portions of said annular sealing regions are substantially free of said thermoplastic material.

3. A method for forming a resealable electronic assembly, comprising:

providing a base having a central region for supporting one or more electronic components and having a first annular sealing region lying between said central region and a periphery of said base;

providing a lid intended to be joined to said base to seal said assembly, said lid having a second annular sealing region, wherein said first and second annular sealing regions mate when said lid and base are joined together, wherein said lid has an annular recess in said lid located proximate said second annular sealing region so that, when said base and lid are joined, a first portion of said first annular sealing region faces a first portion of said second annular sealing region and said recess faces a second portion of said first annular sealing region and communicates with a relief space of said base or lid; and providing a thermoplastic sealing material located in said recess for removably sealing said base and lid together; and heating said thermoplastic material to removably seal said lid and base by means of said thermoplastic material, so that excess thermoplastic material extrudes into said relief space.

4. The method of claim 3 wherein the steps of providing and heating said thermoplastic material comprise maintaining said mating portions of said annular sealing regions substantially free of said thermoplastic material.

5. A resealable electronic module comprising:

a base for supporting one or more electronic components in a central region thereof and a lid for closing the module, wherein the base has an exterior periphery and a first region for mating with the lid, and wherein the lid has a second region for mating with the base;

a recess located in the base adjacent to the mating region of the base and which, when the base and lid are joined so that first portions of the mating regions are in substantial contact, the recess faces a second portion of the mating region of the lid and communicates with either the central region or the periphery of the base but not with both at the same time; and a thermoplastic sealing material located in the recess for demountably sealing the lid and base.

6. The module of claim 5 wherein the mating regions are substantially free of the thermoplastic sealing material.

7. The module of claim 6 wherein the mating regions are further joined by welding or soldering.

8. The module of claim 5 wherein the thermoplastic material has a first sealing temperature and the mating regions are further joined by solder having a second sealing temperature greater than the first sealing temperature.

9. A method for making a resealable multichip electronic module comprising:

providing a base for supporting one or more electronic components in a central region thereof and providing a lid for closing the module, wherein the base has an exterior periphery and a first region for mating with the lid, and wherein the lid has a second region for mating with the base;

providing a recess located in the base adjacent to the mating region of the base and which, when the base and lid are joined so that first portions of the mating regions are in substantial contact, the recess faces a second portion of the mating region of the lid and communicates with either the central region or the periphery of the base but not with both at the same time;

providing a thermoplastic sealing material located in the recess for demountably sealing the lid and base; and heating the thermoplastic material to seal the lid and base together.

10. The method of claim 9 wherein the providing and heating steps comprise maintaining the mating regions substantially free of the thermoplastic material.

11. The method of claim 9 further comprising joining the mating regions by welding or soldering.

12. The method of claim 9 further comprising testing the module, then reheating the thermoplastic material to remove the lid, repairing or inspecting the module, and then resealing the lid and base.

13. The method of claim 12 wherein the resealing step comprises resealing by welding or soldering.

14. A resealable electronic module comprising:

a base for supporting one or more electronic components in a central region thereof and a lid for closing the module, wherein the base has an exterior periphery and a first region for mating with the lid, and wherein the lid has a second region for mating with the base;

a recess located in the lid adjacent to the second region and which, when the base and lid are joined so that first portions of the mating regions are in substantial contact, the recess faces a second portion of the mating region of the base and communicates with either the central region or the periphery of the base but not with both at the same time; and a thermoplastic sealing material located in the recess for demountably sealing the lid and base.

15. A method for making a resealable multichip electronic module comprising:

providing a base for supporting one or more electronic components in a central region thereof and providing a lid for closing the module, wherein the base has an exterior periphery and a first region for mating with the lid, and wherein the lid has a second region for mating with the base;

providing a recess located in the lid adjacent to the second region and which, when the base and lid are joined so that first portions of the mating regions are in substantial contact, the recess faces a second portion of the mating region of the base and communicates with either the central region or the periphery of the base but not with both at the same time;

providing a thermoplastic sealing material located in the recess for demountably sealing the lid and base; and heating the thermoplastic material to seal the lid and base together.

* * * * *